United States Patent
Philippe et al.

(10) Patent No.: US 8,788,555 B2
(45) Date of Patent: Jul. 22, 2014

(54) METHOD FOR UPDATING AN ENCODER BY FILTER INTERPOLATION

(75) Inventors: Pierrick Philippe, Melesse (FR); David Virette, Munich (DE)

(73) Assignee: Orange, Paris (FR)

( * ) Notice: Subject to any disclaimer, the term of this patent is extended or adjusted under 35 U.S.C. 154(b) by 690 days.

(21) Appl. No.: 13/056,154

(22) PCT Filed: Jul. 3, 2009

(86) PCT No.: PCT/FR2009/051302
§ 371 (c)(1),
(2), (4) Date: Jan. 27, 2011

(87) PCT Pub. No.: WO2010/012925
PCT Pub. Date: Feb. 4, 2010

(65) Prior Publication Data
US 2011/0145310 A1    Jun. 16, 2011

(30) Foreign Application Priority Data
Jul. 29, 2008    (FR) ...................................... 08 55228

(51) Int. Cl.
*G06F 17/17*    (2006.01)

(52) U.S. Cl.
USPC .......................................... 708/313; 708/300

(58) Field of Classification Search
None
See application file for complete search history.

(56) References Cited

U.S. PATENT DOCUMENTS

| | | | | |
|---|---|---|---|---|
| 6,085,077 A | * | 7/2000 | Fields et al. | 455/303 |
| 6,298,361 B1 | * | 10/2001 | Suzuki | 708/313 |
| 6,856,653 B1 | * | 2/2005 | Taniguchi et al. | 375/285 |
| 7,369,989 B2 | * | 5/2008 | Absar et al. | 704/203 |
| 2004/0267542 A1 | * | 12/2004 | Absar et al. | 704/500 |
| 2008/0249765 A1 | * | 10/2008 | Schuijers | 704/203 |

FOREIGN PATENT DOCUMENTS

FR    2 828 600 A1    2/2003

OTHER PUBLICATIONS

Martucci, "Interpolation in the DST and DCT Domains," 2000 International Conference on Image Processing, Proceedings, Sep. 10-13, 2000, Piscataway, NJ, USA, IEEE, vol. 2, pp. 339-342 (Sep. 10, 2000).

Pinchon et al., "Design Techniques for Orthogonal Modulated Filterbanks Based on a Compact Representation," IEEE Transactions on Signal Processing, IEEE Service Center, New York, NY, US, vol. 52, (6), pp. 1682-1692 (Jun. 1, 2004).

* cited by examiner

*Primary Examiner* — Michael D Yaary
(74) *Attorney, Agent, or Firm* — Drinker Biddle & Reath LLP

(57) ABSTRACT

A method for updating the processing capacity of an encoder or decoder to use a modulated transform having a size greater than a predetermined initial size is provided, particularly, where the encoders or decoders are for storing an initial prototype filter defined by an ordered set of initial size coefficients. A step is provided for constructing a prototype filter of a size greater than the initial size to implement the modulated transform of the greater size by inserting at least one coefficient between two consecutive coefficients of the initial prototype filter.

14 Claims, 5 Drawing Sheets

METHOD FOR UPDATING AN ENCODER BY FILTER INTERPOLATION

CROSS-REFERENCE TO RELATED APPLICATIONS

This application is the U.S. national phase of the International Patent Application No. PCT/FR2009/051302 filed Jul. 3, 2009, which claims the benefit of French Application No. 08 55228 filed Jul. 29, 2008, the entire content of which is incorporated herein by reference.

FIELD OF THE INVENTION

The invention relates to signal processing, notably for an audio signal (such as a voice signal) and/or a video signal in the form of a succession of samples. It particularly concerns signal processing by transform and relates to the field of modulated transforms.

Modulated transforms have applications in the analysis and transmission of digital signals (therefore a succession of samples over time within a sampling period). They also have applications in signal synthesis. For example, signal encoding can make use of an analysis filter bank, quantification, and a synthesis filter bank.

BACKGROUND

For modulated transforms, usually prototype filters are defined which are modulated to different frequency values. Thus, there is provided a set of channels representing the signal at different "frequency" positions.

The modulations can be done by an operation of the type: $h_k(n) = h(n) \cdot W(k,n)$, where:

n is a time index corresponding to a multiple of the sampling period, k is an index representing a frequency channel, and L is the length of the filter (and of the modulation).

In addition, in the above expression:

h(n) (where $0 \leq n < L$) defines the prototype filter which may have a complex value, W(k,n) (where $0 \leq n < L$) defines the modulating function for the channel k which also may have complex values, $h_k(n)$ (where $0 \leq n < L$) defines the modulated filter for the channel k.

To perform a signal analysis, for encoding for example, the signal x(n) to be analyzed is projected on the modulated filter by a scalar product operation:

$$y_k = \langle x, h_k \rangle = \sum_{n=0}^{L-1} x(n) \cdot h_k(n).$$

The analyzed signals can be the result of several projections, for example in the form: $y_k = \langle x, h_k \rangle + \lambda \langle x, h'_j \rangle$, where $\lambda$, $h'_j$ and j are respectively a gain, a modulation, and a frequency index, with these latter values possibly different from $h_k$ and k.

These analysis operations can be successive over time, resulting in a series of signals $y_k$ evolving over time.

Thus one can write:

$$y_{k,m} = \langle x_m, h_k \rangle = \sum_{n=0}^{L-1} x(n+mT) \cdot h_k(n),$$

with m indicating an index of blocks of successive samples (a "frame") and T defining the duration of a frame (as the number of samples).

Modulated transforms also have applications in signal synthesis. For this type of application, content will be generated in a certain number of frequency channels and these channels will be put together to reconstruct a digital signal.

A signal $\hat{x}(n)$ is thus synthesized by projection of the transformed signals $y_k$ onto the M synthesis vectors. First an expression $\tilde{x}(n)$ is defined such that:

$$\tilde{x}(n) = \langle y, h_k \rangle = \sum_{k=0}^{M-1} y_k \cdot h_k(n) \text{ for } 0 \leq n < L.$$

The signals $y_k$ can evolve over time, so that the synthesis will allow generating a signal of an arbitrary length:

$$\tilde{x}(n+mT) = \langle y_m, h_k \rangle = \sum_{k=0}^{M-1} y_{k,m} \cdot h_k(n) \text{ for } 0 \leq n < L.$$

The vectors defined by the expressions $\tilde{x}$, for $0 \leq n < L$, are shifted by M samples then added together, to yield a synthesized signal $\hat{x}$. This is called an overlap add.

Modulated transforms advantageously have applications in signal encoding.

In frequency encoding systems, an analysis transform is performed by means of modulated analysis filters $h_k$ where:

$$y_{k,m} = \langle x_m, h_k \rangle = \sum_{n=0}^{L-1} x(n+mT) \cdot h_k(n).$$

The signals $y_{k,m}$ carrying useful information (the usefulness can be judged for example using a perceptive distortion criterion) are then approximated and sent in encoded form.

At the decoder, the approximated components $y_{k,m}$ received are synthesized by reverse transformation to restore an approximation of the original samples.

The synthesis is done by way of a set of modulated synthesis filters $f_k$:

$$\tilde{x}(n+mT) = \langle y_m, f_k \rangle = \sum_{k=0}^{M-1} y_{k,m} \cdot f_k(n)$$

Then the overlap add operation is performed to obtain a reconstructed and decoded signal $\hat{x}$.

An interesting class of modulated transforms is defined by perfect reconstruction transforms.

These transforms obtain from the decoding a decoded signal that substantially corresponds, or perfectly corresponds in the case of perfect reconstruction, to the initial signal when the transformed components $y_k$ are not modified, aside from a delay R, meaning $\hat{x}(n) = x(n-R)$.

The reconstruction can also be an "almost perfect" reconstruction when the difference between the reconstructed signals x and x̂ can be considered to be negligible. For example, in audio encoding, a difference having an error magnitude 50 dB lower than the magnitude of the processed signal x can be considered to be negligible.

The most commonly used transforms are ELT (Extended Lapped Transforms), which provide a perfect reconstruction and which use a filter of length L=2·K·M. The MDCT transforms (Modified Discrete Cosine Transforms) which are MLT (Modulated Lapped Transforms) are a special case where K=1.

Quadrature Mirror Filters (QMF), or Pseudo Quadrature Mirror Filters (PQMF) are an almost perfect reconstruction solution using different modulation terms.

These different transforms can be with real or complex coefficients. They may or may not use symmetric prototype filters.

In order to satisfy the condition of perfect or almost perfect reconstruction, for any form of processed signal, the modulated analysis and synthesis filters must be linked to each other. Thus, relations link the modulation terms and the prototype filters used in the analysis and synthesis. For example, in cosine-modulated systems (MDCT, ELT, PQMF, or other systems), the modulation terms in the analysis and synthesis are linked, for example in the form: W(k,n)=W'(k,n+φ)), W and W' indicating the modulations used in the analysis and synthesis respectively and φ indicating a phase shift term.

A commonly used special case is defined by φ=0. The modulations are then identical in analysis and synthesis.

The prototype filters for analysis and synthesis can also be linked to each other to ensure (almost) perfect reconstruction, with a constraint of the following frequently used type: h(L−1−n)=f(n), where h and f are the prototype filters used in the analysis and synthesis.

The modulations W are constrained to ensure perfect reconstruction. For example, one can generally choose for ELT transforms:

$$W(k, n) = \cos\left[\frac{\pi}{M}\left(n + \left(\frac{1+M}{2}\right)\right)\left(k + \frac{1}{2}\right)\right],$$

where 0≤n<L and 0≤k<M, with L=2·K·M.

Similarly, the prototype filters are constrained to ensure perfect reconstruction, with, for example, a constraint of the type:

$$\sum_{i=0}^{2K-2s-1} f(n + iM)h(n + iM + 2sM) = \delta(s),$$

for s = 0, 1, ... , K − 1.

In particular, the prototype filters can be selected from among the following:
those defined analytically in the form of an equation and, in this class, a filter commonly used for the MDCT transform (with K=1) is expressed by:

$$h(n) = f(n) = \sin\left[\frac{\pi}{2M}(n + 0.5)\right],$$

with 0≤n<L where L=2·M, the filters resulting from a digital optimization according to a criterion which does not allow deducing an analytical function, such as, for example, a filter which can be obtained by minimizing an amount under the perfect reconstruction constraint (this amount can be a stopband attenuation from a cutoff frequency, or a coding gain, or more generally any other amount judged to be relevant to the encoding quality).

As was mentioned above, the prototype filters may or may not be symmetric. The symmetry relation is written as follows:

h(L−1−n)=h(n).

The modeling of the modulated transforms implementation described above is provided for illustrative purposes. In actual implementations of these transforms, all the described calculations are not carried out in this form. For reasons of computational efficiency, time, and use of computational resources, "fast" implementations are used. These implementations do not specifically apply the calculations presented above, but these calculations are valid.

The modulated transforms as presented below are defined by fast algorithms for efficient implementation with computational resources. These algorithms are based on fast Fourier transforms or are derived from them, such as fast cosine or sine transforms (for example type IV DCT transforms).

A transform order for the fast algorithm which is less than or equal to the number M of frequency components is sufficient for the implementation of these transforms. These transformations are efficient because their complexity is proportional to $\log_2(M)$ of the number M of components.

A operation reducing L samples to a number less than or equal to M components is applied prior to the fast transform.

A complete algorithm from the transformation to the analysis can combine:
multiplying samples of size L by the prototype filter,
combining the result of this multiplication, meaning a linear combination based on additions and coefficient multiplications, to allow deducing from the L weighted values a number less than or equal to M components,
a fast transform of an order less than or equal to M These operations are done in reverse order to perform the synthesis transformation.

FIG. 1 illustrates the analysis and synthesis as described above. The signal x is presented to an encoder COD comprising a prototype filter φ. A set of samples of size L of the signal are then multiplied by the prototype filter in the module MULT1. Then, in the module CL1, a linear combination of the samples multiplied by the prototype filter is performed in order to change from L samples to M components. Then, a fast transform TR1 is performed, before the samples are sent to a decoder DECOD.

Upon receipt of the samples, the decoder applies a fast transform TR2. Then, conversely to what was done in the encoder, a linear combination CL2 is performed to return to the initial number L of samples. These samples are then multiplied by the prototype filter of the decoder DECOD in order to reconstruct a signal x̃, from which the signal x̂ is obtained by an overlap add operation.

The coefficients of the prototype filter, of the encoder or decoder, must be stored in memory in order to perform the analysis or synthesis transform. Obviously, in a particular system using modulated transforms of different sizes, the prototype filter for each of the sizes used must be represented in memory.

In the favorable case where the filters are symmetric, only L/2 coefficients need to be stored, the L/2 other ones being determined from these stored coefficients without any arithmetic operation. Thus, for a MDCT (K=1), if a transform of size M and 2M is needed, then (M+2M)=3M coefficients must be stored if the prototypes are symmetric and (2M+4M)=6M otherwise. A typical example for audio encoding is M=320 or M=1024. Thus, for the asymmetrical case this requires storing 1920 and 6144 coefficients respectively.

Depending on the accuracy desired for the coefficient representation, 16 bits or even 24 bits are necessary for each coefficient. This implies significant memory requirements for low cost processors.

If we have a prototype filter for a transform of size UM, then it is possible to obtain coefficients for the transform of size M by decimation. Conventionally, this consists of taking a filter coefficient from U in this specific example.

However, if we only have a filter for the transform of size M, it is not as simple to extend this filter to a use with MU coefficients. A direct method of polynomial interpolation does not maintain the reconstruction accuracy at the same level as for the base transform of size M. This type of method is therefore not optimal.

When a core encoding system is implemented in an encoder, it can be useful to extend it, for example when updating a standardized version of the encoding system. For example, standardized ITU G.718 and ITU G.729.1 encoders rely on MDCT modulated transforms of respective sizes M=320 and M=160. In an extension of these standards to operate these encoders at a higher sampling frequency, referred to as a super-wideband extension, MDCTs of greater sizes are necessary. An MDCT of size M'=640 must be applied in this extension.

In an extension according to the related art, the amount of storage for expressing coefficients of a new prototype filter would have to be extended. In addition, intervention at the encoder would be necessary in order to store the coefficients.

Embodiments of the invention offer a way of saving memory, in ROM for storing the coefficients and/or in RAM for the transform calculation.

SUMMARY

To that purpose, there is provided a method for updating the processing capacity of an encoder or decoder in order to use a modulated transform having a size greater than a predetermined size, such an encoder or decoder being able to store an initial prototype filter defined by an ordered set of coefficients of an initial size. A step for constructing a prototype filter of a size greater than said initial size is provided to implement the modulated transform of a size greater than the predetermined size, by inserting at least one coefficient between two consecutive coefficients of the initial prototype filter.

Thus, coefficients already present in the encoder are used instead of storing additional coefficients for the transform.

In this manner is it possible to define a transform of size UM by only storing a single prototype filter designed for a transform of size M.

Of course, the additional coefficients can be used in analysis or synthesis or at both ends of a sequence of processing operations.

Embodiments of the invention have an advantageous application in embedded systems, in which the price of memory represents a significant part of the system cost. For example, in mobile telephony the consumption, miniaturization, and price of the implemented encoders/decoders must be optimized. The reduction of memory requirements provided by embodiments of the invention enables such optimization.

"Updating" is understood to mean the passage of an operating encoder/decoder from an initial state to a different next state. However, the embodiments of the invention also relate to the initialization of an encoder/decoder which has not yet been used to perform encoding/decoding.

Advantageously, the inserted coefficients are calculated from coefficients of the initial filter.

For example, the coefficient inserted between the two consecutive coefficients is calculated by weighting at least the two consecutive coefficients.

In addition, a method can be provided in which the initial prototype filter satisfies a predetermined reconstruction relation, for example a perfect reconstruction relation. In this case, the weighting is done by means of at least one weighting function calculated from the reconstruction relation.

It must be certain that the added coefficients still permit the encoder to function properly. Thus the additional coefficients are determined based on the weighting of coefficients of the initial prototype and must enable a transform with perfect or almost perfect reconstruction.

In some embodiments, the weighting function is calculated for each position of the coefficient inserted between the two consecutive coefficients.

In one embodiment of the method, the size of the constructed filter h' is U times greater than the size M of the initial filter h, where U and M are natural numbers strictly greater than one. In this case, a shift value S is defined such that $0 \leq S < U$, S being a natural number and the constructed and initial filters satisfying the relation: $h'(U \times n + S) = h(n)$, for any natural number n such that $0 \leq n < M$.

In addition, two weighting functions $P_\delta$ and $Q_\delta$, may be defined for any natural number $\delta$ satisfying $0 < \delta < U$. Thus the inserted coefficients are defined by the relation: $h'(U \times n + S + \delta) = P_\delta(n) \times h(n) + Q_\delta(n) \times h(n+1)$, for an integer n where n<M.

The two weighting functions can also be equal. In addition, the initial prototype filter can be extended symmetrically, antisymmetrically, or by adding zero coefficients. These measures can be useful for defining missing coefficients in the initial filter in order to construct the prototype filter.

It is understood that the prototype filter construction proposed by embodiments of the invention allows further reducing the number of coefficients when the initial prototype filter contains zeros. The interpolated window will then have zeros in its impulse response and ranges comprising equal coefficients. The memory requirements will therefore be further reduced.

Depending on the weighting interpolation scheme used, the process described above allows obtaining prototype filters which have interesting frequency responses in the bandwidth.

Embodiments of the invention also relate to a computer program comprising instructions for implementing the method described above when said program is executed by a processor. It additionally relates to a computer-readable medium on which such a computer program is recorded.

Embodiments of the invention also relate to an encoder and a decoder adapted to implement the method described above.

An encoder/decoder according to embodiments of the invention comprises at least two memory areas, a first memory area for storing a first set of coefficients defining an initial prototype filter of a given size, and a second memory area for storing a computer program comprising instructions for delivering a second set of coefficients determined from coefficients in the first set. The set formed by inserting coefficients from the second set between two consecutive coefficients of the first set, defines a prototype filter of a size greater than that of the initial prototype filter.

In addition, this encoder/decoder can comprise a means for implementing the updating method described above for constructing the prototype filter of a size greater than that of the initial prototype filter.

In addition, a method of encoding/decoding by modulated transform can be provided, implemented by an encoder/decoder and comprising the following steps:

obtaining the size of a modulated transform to be used for the encoding/decoding, if the size of the transform is greater than the size of an initial prototype filter of the encoder/decoder, updating the processing capacity of the encoder/decoder according to the updating method described above, encoding/decoding the signal by means of the modulated transform, making use of the prototype filter constructed during the update.

Advantageously, the encoding/decoding method is implemented by an encoder/decoder as described above.

An encoding/decoding by modulated transform is an encoding/decoding which makes use of such a transform.

The step "obtaining the size of a modulated transform" can, for example, correspond to receiving a signal containing information that indicates said size. Such a signal can, for example, indicate an encoding mode. In this case a low resolution mode is provided for, with data frames of reduced size and therefore requiring a transform of reduced size, and a high resolution mode is provided for, with data frames of larger size requiring a transform of larger size. However, this information may also be read from a computer file. This determination may also correspond to an input of the encoder/decoder.

Of course, updating the encoder/decoder can also be understood to mean initializing the encoder/decoder.

The choice of size of the modulated transform can also be made based on the number of samples, for example dependent upon the size of the frames or sub-frames to be processed by the encoder/decoder. The larger the number of samples per frame or sub-frame, the larger the size of the transform must be.

Thus transforms of variable sizes can be used at various times as needed, with the prototype filters being updated at various times, based on an initial prototype.

BRIEF DESCRIPTION OF THE DRAWINGS

Other features and advantages of the invention will be apparent from examining the following detailed description and the attached drawings, which include.

DETAILED DESCRIPTION

Below is a description of one embodiment of the invention which allows constructing a prototype window from a prototype window corresponding to a transform of a smaller size. This occurs within the general context of ELT modulated transforms, with or without symmetric windows. In the context of ELTs, the prototype filter has a length L=2KM which can include a certain number M of zeros at its end, with M defining the number of transformed coefficients.

The analysis transformation is written as follows:

$$y_{k,m} = \langle x_m, h_k \rangle = \sum_{n=0}^{L-1} x(n+mM) \cdot h(n) \cdot W(k,n)$$

for $0 \le k < M$, where n is a time index corresponding to a multiple of the sampling period, k is an index representing the frequency channel concerned, h(n), $0 \le n < L$, defines the analysis prototype filter, W(k,n) $0 \le n < L$, defines the modulating function for the frequency k.

The synthesis transformation is written as:

for $0 \le n < L$, where $$\tilde{x}(n+mM) = \sum_{k=0}^{M-1} y_{k,m} \cdot f(n) \cdot W(k,n)$$

f(n) $0 \le n < L$, defines the synthesis prototype filter, $\tilde{x}(n)$ is a signal of length L containing spurious terms which will be deleted by an overlap add operation to obtain a signal $\hat{x}(n)$ of a duration equivalent to x(n).

For ELTs the modulation W(k,n) is defined by:

$$W(k,n) = \cos\left[\frac{\pi}{M}\left(n + \frac{\pm M + 1}{2}\right)\left(k + \frac{1}{2}\right)\right]$$

$0 \le k < M$ and $0 \le n < L$.

These transformations ensure a perfect reconstruction, meaning that $\hat{x}(n)$ is identical to x(n) (allowing for the delay).

To ensure a perfect reconstruction, the filters f and h must satisfy the following constraint:

$$\sum_{i=0}^{2K-2s-1} f(n+iM)h(n+iM+2sM) = \delta(s)$$

s=0, 1, . . . , K−1

With the function δ defined as $$\begin{cases} \delta(s=0) = 1 \\ \delta(s \ne 0) = 0 \end{cases}$$

One embodiment concerns MDCTs, meaning the subset of ELTs having filters of length L=2M, meaning where K=1. The perfect reconstruction condition is then written as:

$f(n)h(n)+f(n+M)h(n+M)=1$, for $0 \le n < M$.

One solution consists of taking:

$f(n)=h(2M-1-n)$ for $0 \le n < 2M$.

This allows using the same prototype filter coefficients for analysis and synthesis. Only a time reversal, corresponding to the term 2M−1−n, will need to be considered in the synthesis algorithm.

In this case, the perfect reconstruction relation is written as:

$$d(n)=h(n)h(2M-1-n)+h(n+M)h(M-1-n)=1 \text{ for } 0 \leq n < M.$$

On the basis of this transformation of size M, a transformation of a larger size is constructed for M'=U·M. Therefore a filter h' is defined for which a certain number of coefficients come from the filter h.

Figure 1:
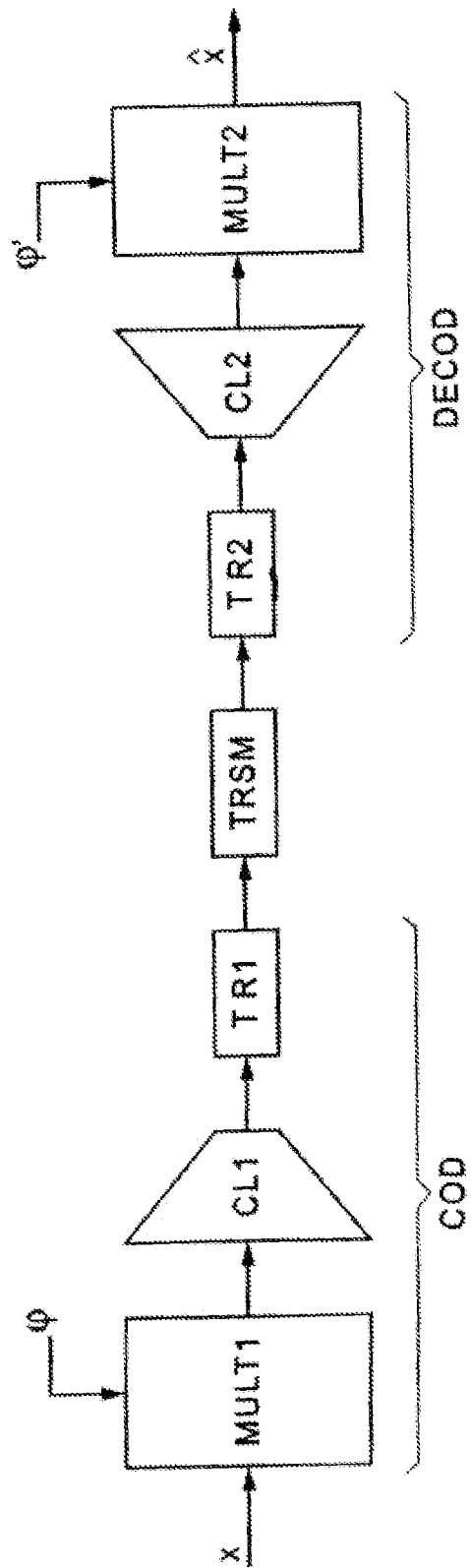
FIG. 1 is a block diagram illustrating a basic the analysis and synthesis.
Figure 2:
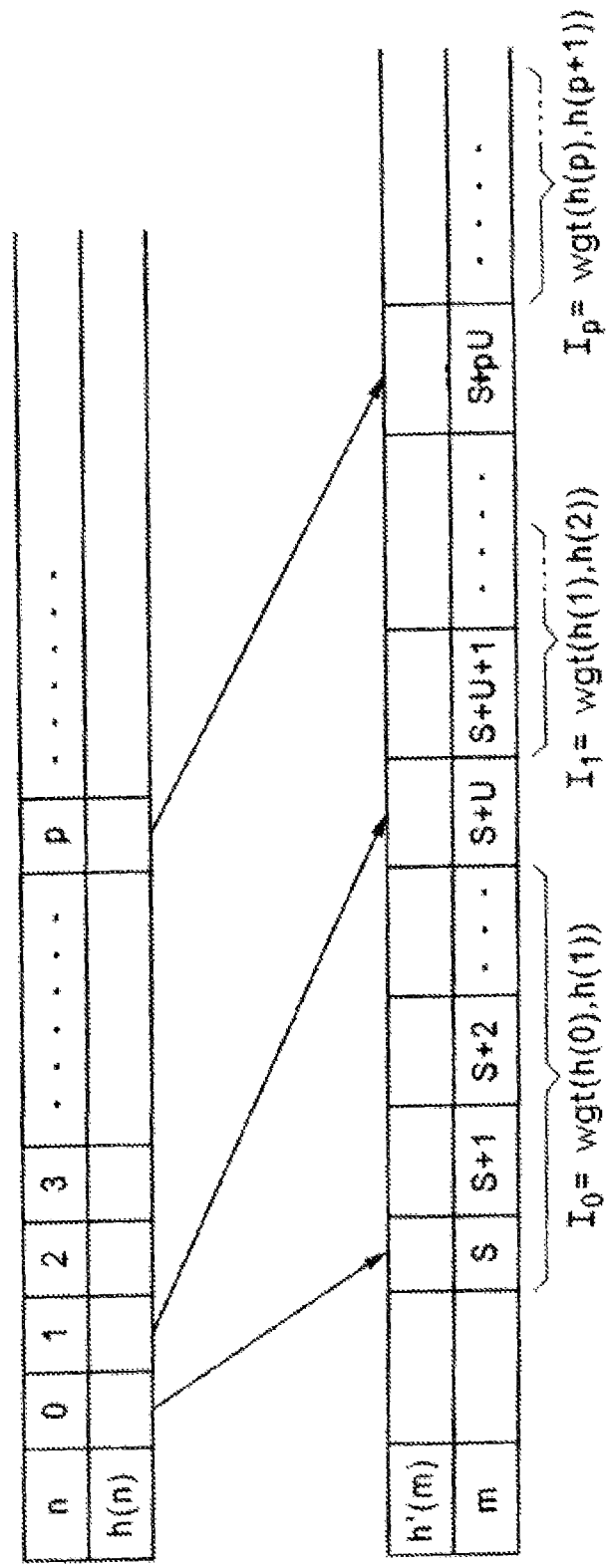
FIG. 2 is a data structure diagram illustrating the insertion of coefficients between two consecutive coefficients of the initial filter, in order to construct the prototype filter.

Thus, as represented in FIG. 2, the filter h' is constructed in the following manner:

$$h'(U \cdot n+S)=h(n) \ 0 \leq n < L. \text{ With } S \text{ a shift value, } 0 \leq S < U.$$

In order to ensure perfect reconstruction, the prototype filter of length L'=2·M'=2·U·M must satisfy a reconstruction relation similar to the one presented above:

$$d'(n) = h'(n)h'(2M'-1-n) + h'(n+M')h'(M'-1-n)$$
$$= h'(n)h'(2UM-1-n) + h'(n+UM)h'(UM-1-n) = 1,$$

keeping in mind that samples with indexes that are a multiple of U at position S are taken from h(n).

Next the embodiments for determining the missing values of h' are described.

General Embodiment

Figure 3:
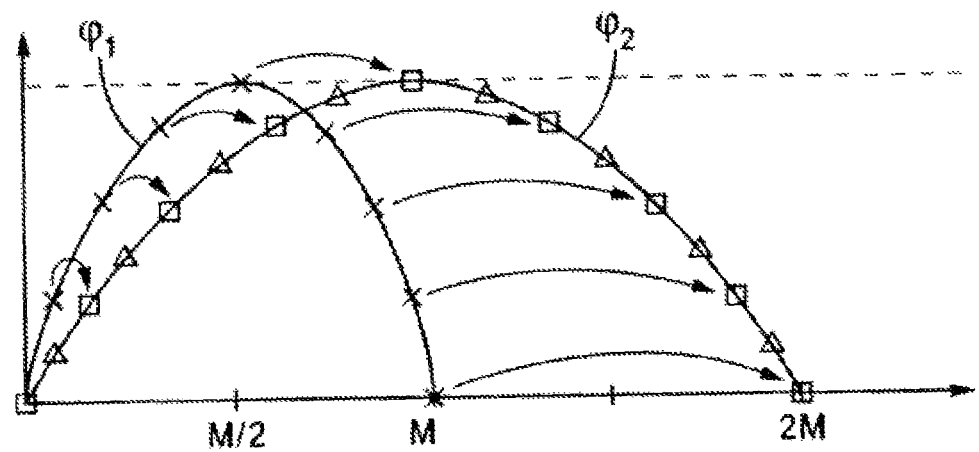
FIG. 3 is a graph illustrating an initial filter and a filter constructed from the initial filter.
Figure 3:
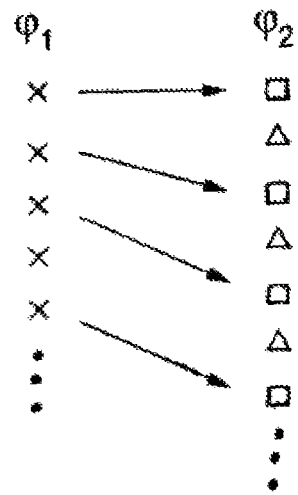

FIG. 3 illustrates the principle of determining the constructed filter. This begins with a filter $\phi_1$ of size M. Next the coefficients of this filter $\phi_1$ are redistributed over a larger interval of size 2M. Lastly, the intermediate coefficients are calculated in order to complete the final filter $\phi_2$. The intermediate samples, as shown in FIG. 2, are constructed using the equation which defines a general embodiment:

$$h'(U \cdot n+S+\delta)=P_\delta(n)h(n)+Q_\delta(n)h(n+1).$$

$P_\delta(n)$ and $Q_\delta'(n)$ where n<M, and δ is an integer such that 0<δ<U, are weighting functions.

If S=0, initial delta=0 and initial n n0=0
If S!=0, initial delta=U−S and initial n n0=−1

Thus $P_\delta(-1)$ and $Q_\delta(-1)$ will be defined to allow the calculation of h'(0)=h'(U·(−1)+S+δ) which is necessary when S is not zero. The first value of delta will be δ=U−S.

It should be noted that the expression for h' may make use of undefined points. For example, h'(U·(2M−1)+S+δ) makes use of h(2M) which is not defined.

To define the missing coefficients, the filter h can be extended in the set of formulas by one of the following:

$h(2M+n)=-h(2M-1-n)$, by antisymmetry, $h(2M+n)=+h(2M-1-n)$, for $n \geq 0$, by symmetry, $h(2M+n)=0$, adds zero coefficients.

Similarly, h can be extended for negative indexes. For example, in order to define h'(0) one must define h(−1). Thus this coefficient can be determined by extending h towards the negative indexes by one of the following:

$h(-1-n)=-h(n)$, by antisymmetry, $h(-1-n)=+h(n)$, for $n \geq 0$, by symmetry, $h(-1-n)=0$, by adding zero coefficients.

In other cases, extensions towards negative samples and those greater than L are done in the modulo sense by multiple duplication of the support 0 . . . L−1.

To ensure the perfect reconstruction of h'(n), d'(n) is rewritten in one particular point:

$$d'(Un+S)=h'(Un+S)h'(2UM-1-Un-S)+h'(UM+Un+S)h'(UM-1-Un-S)=1,$$

with $$d'(Un+S)=h'(Un+S)h'(U(2M-1-n)+U-1-S)+h'(U(M+n)+S)h'(U(M-n-1)+U-1-S)$$

hence:

$$h(n)[P_{U-1-2S}(M-1-n)h(2M-1-n) + Q_{U-1-2S}(M-1-n)h(2M-n)] +$$
$$h(M+n)[P_{U-1-2S}(M-1-n)h(M-1-n) +$$
$$Q_{U-1-2S}(M-1-n)h(M-n)] = 1$$
$$P_{U-1-2S}(M-1-n)[\underline{h(n)h(2M-1-n) + h(M+n)h(M-1-n)}] +$$
$$Q_{U-1-2S}(M-1-n)[h(n)h(2M-n) + h(M-n)h(M+n)] = 1$$
$$P_{U-1-2S}(M-1-n) =$$
$$1 - Q_{U-1-2S}(M-1-n)[h(n)h(2M-n) + h(M-n)h(M+n)]$$

which is equivalent to:

$$P_{U-1-2S}(n)=1-Q_{U-1-2S}(n)[h(M-1-n)h(M+1n)+h(n+1)h(2M-1-n)]$$

In conclusion, given a choice of Q, a weighting P can be established which obtains the perfect reconstruction.

Embodiment with Single Weighting

One particular embodiment consists of the restriction P=Q. In this case, a direct expression can be obtained for the weighting function:

$$P_{U-1-2S}(n)[1 + h(n+1)h(2M-1-n) + h(M-1-n)h(M+1+n)] = 1$$

$$\boxed{P_{U-1-2S}(n) = \frac{1}{1 + h(n+1)h(2M-1-n) + h(M-1-n)h(M+1+n)}}$$

d' can be written at another point $$d'(Un+S+1) = h'(Un+S+1)h'(2UM-1-Un-S-1) + h'(UM+Un+S+1)h'(UM-1-Un-S-1) = 1$$

$$d'(Un+S+1) = h'(Un+S+1)h'(U(2M-1-n)+U-S-2) + h'(U(M+n)+S+1)h'(U(M-1-n)+U-S-2) = 1$$

-continued $$P_1(n)[h(n) + h(n+1)]h'(U(2M - n - 1) + U - S - 2) +$$
$$P_{-1}(n)[h(M+n) + h(M+n+1)]h'(U(M-1-n) + U - S - 2) = 1$$
$$P_1(n)P_{U-2S-2}(M-1-n)[h(n)+h(n+1)][h(2M-1-n)+h(2M-n)] +$$
$$P_1(n)P_{U-2S-2}(M-1-n)[h(M+n)+h(M+n+1)]$$
$$[h(M-1-n)+h(M-n)] = 1$$

$$P_1(n)P_{U-2S-2}(M-1-n) =$$
$$\frac{1}{[h(n)+h(n+1)][h(2M-1-n)+h(2M-n)] + [h(M+n)+h(M+n+1)][h(M-1-n)h(M-n)]}$$

$$P_1(n)P_{U-2S-2}(M-1-n) =$$
$$\frac{1}{1 + h(n)h(2M-n) + h(n+1)[h(2M-1-n)+h(2M-n)] + h(M+n)h(M-n)+h(M+n+1)[h(M-1-n)+h(M-n)]}$$

A relation is then obtained which allows constructing a weighting series $P_1(n)$ enabling perfect reconstruction, based on a given $P_{U-2S-2}(M-1-n)$.

The definition of the weighting functions can be generalized based on this expression. They are paired and based on the following ($\delta \neq 0$):

$$P_\delta(n)P_{U-2S-1-\delta}(M-1-n) =$$
$$\frac{1}{1 + h(n)h(2M-n) + h(n+1)[h(2M-1-n)+h(2M-n)] + h(M+n)h(M-n)+h(M+n+1)[h(M-1-n)+h(M-n)]}$$

This expression allows generating weights which will construct the interpolated filter under a defined criterion.

For example, the frequency response for h' will be given preference while minimizing its stop-band energy from a given frequency and while maximizing its continuity or coding gain across a particular signal.

Case of Second-order Interpolation

Specific Embodiment U=2, S=0

The filter is interpolated by:

$$h'(2 \cdot n + 0) = h(n)$$
$$h'(2 \cdot n + 1) = P_1(n)h(n) + P_{-1}(n)h(n+1)$$
$$P_1(n) = \frac{1}{1 + h(n+1)h(2M-1-n) + h(M-1-n)h(M+1+n)}$$
$$h'(2 \cdot n + 1) = \frac{h(n) + h(n+1)}{1 + h(n+1)h(2M-1-n) + h(M-1-n)h(M+1+n)}.$$

Figure 4:
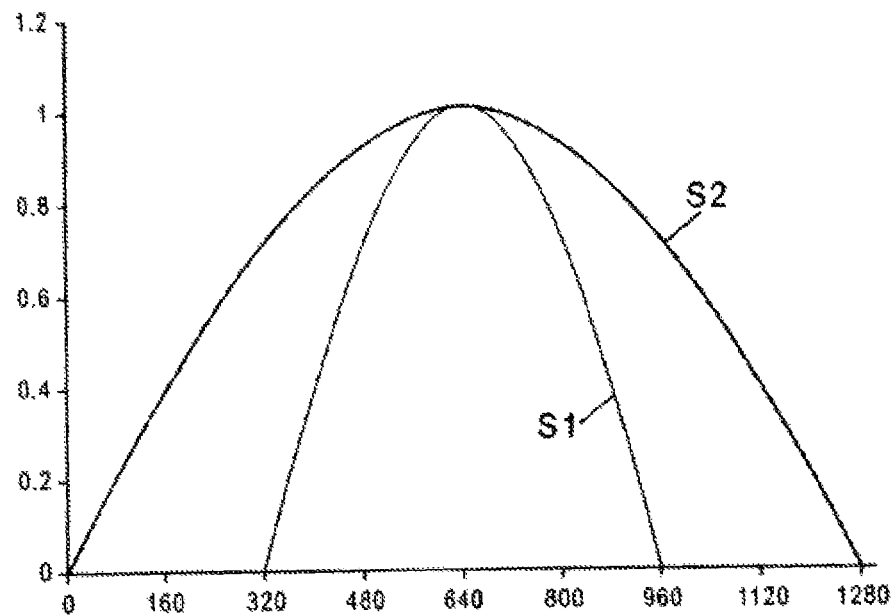
FIGS. 4 and 5 are graphs illustrating filters constructed according to different embodiments of the invention.

FIG. 4 illustrates a prototype filter S1, which is a sinusoidal type filter, of size 640 for an MDCT of 320, and a prototype filter S2 of size 1280 for an MDCT of 640 obtained from S1 according to the present specific embodiment (S1 has deliberately been centered around 640 in order to compare S1 and S2).

Case of Second-order Interpolation with Zero at the End

In a particular embodiment in which h(n) includes zeros at its end (meaning in consecutive indexes starting at n=0, or at n=L-1), with no loss of generality one obtains h(n)=0 for $2M-mZ \leq n < 2M$. Due to the proposed interpolation, the h' will then be zero in the corresponding support. A particular property of the proposed interpolation is as follows:

$$d'(2n) = h'(2n)\underbrace{h'(4M-1-2n)}_{0} + h'(2M+2n)h'(2M-1-2n) = 1$$

$$h'(2M-1-2n) = \frac{1}{h(M+n)}$$

but $d(n) = h(n)h(2M-1-n) + h(M+n)h(M-1-n) = 1$, therefore $$h(M-1-n) = \frac{1}{h(M+n)}.$$

And so:

$$h'(2M-1-2n) = \frac{1}{h(M+n)} = h(M-1-n) = h'(2M-2-2n).$$

This particular choice of interpolation obtains ranges of coefficients that are constant when zeros are imposed on the filter h. These ranges have a length 2 in the example. More generally, it is demonstrated that for an interpolation of order U, the ranges have a length U, in a zone centered around the index n=UM.

Figure 5:
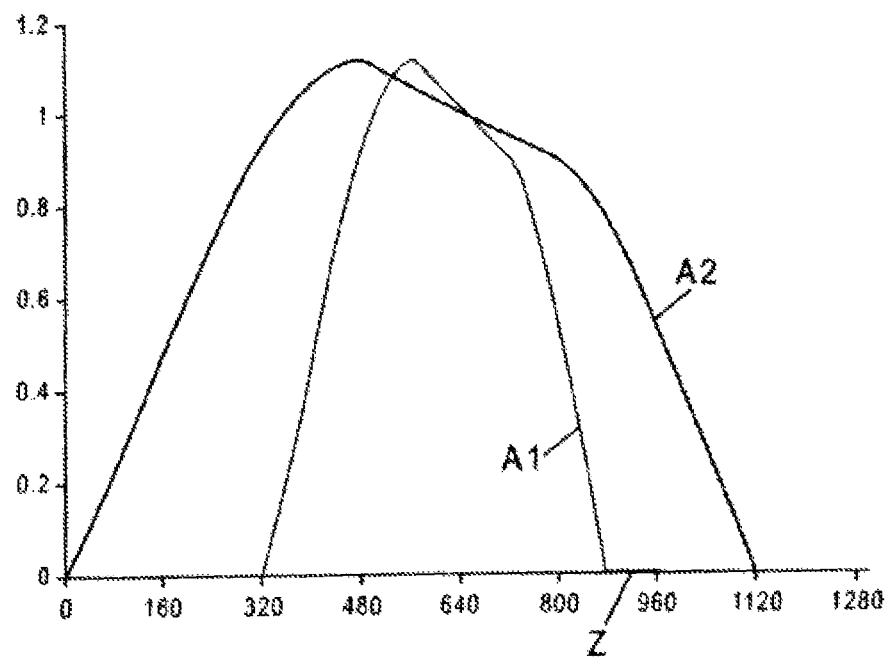

FIG. 5 illustrates a prototype filter A1, "ald" type, of size 640 for an MDCT of size 320, and a prototype filter A2 of size 1280 for an MDCT of 640 constructed from A1 according to the present case. As in FIG. 4, A1 has been centered. The filter A1 comprises 80 zeros at its end Z. Thus A2 comprises constant sample ranges of size 2 due to the fact that A1 comprises zeros at its end.

Figure 6:
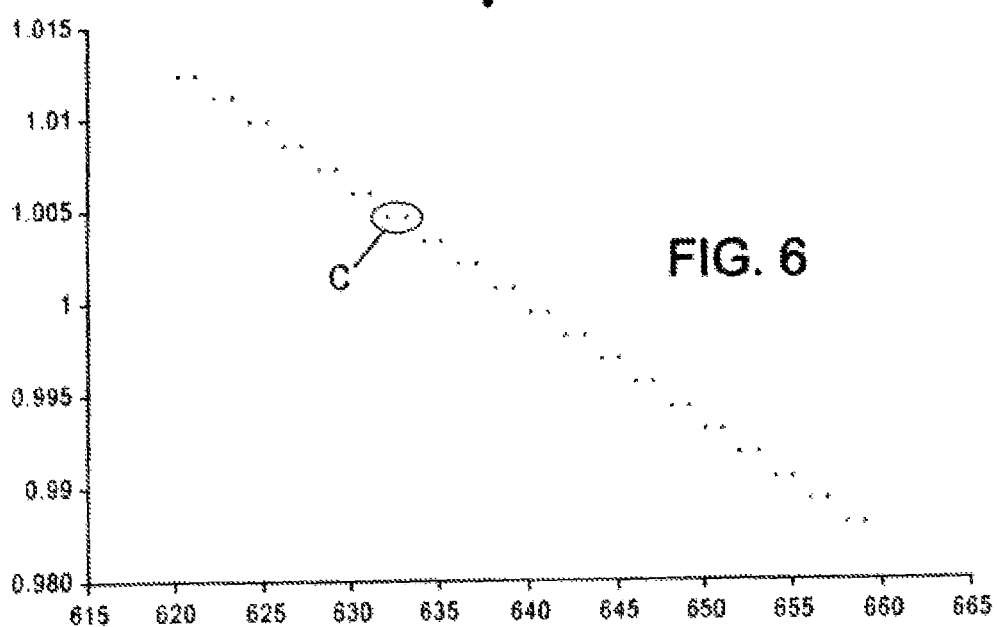
FIG. 6 is a graph illustrating a subset of a filter comprising constant coefficients.

FIG. 6 is an enlarged view of the area of A2 comprising constant samples C.

Implementation

The prototype filters constructed according to the method described above enable a fast implementation.

In the prior art, the first step during analysis consisted of weighting the samples by the window of the transform in question before the fast transform, as presented above.

Here, due to the interpolation, the coefficients of the prototype filter can be arranged to supplement those from the lower transform order.

For example, for an interpolation of order U with a shift of S, one can write:

$$y'_{k,m} = \langle x_m, h'_k \rangle = \sum_{n=0}^{UL-1} x(n+mT) \cdot h'(n) \cdot W'(k,n)$$

$$h'(U \cdot n + S) = h(n)$$

$$h'(U \cdot n + S + \delta) = P_\delta(n)h(n) + Q_\delta(n)h(n+1)$$

$$y'_{k,m} = \langle x_m, h'_k \rangle = \sum_{n=0}^{L-1} x(Un+S+mT) \cdot h'(Un+S) \cdot W'(k, Un+S) +$$

$$\sum_{\substack{\delta=0 \\ \delta \neq S}}^{U-1} \sum_{n=0}^{L-1} x(Un+S+\delta+mT) \cdot h'(Un+S+\delta) \cdot W'(k, Un+S+\delta)$$

$$y'_{k,m} = \langle x_m, h'_k \rangle = \sum_{n=0}^{L-1} x(Un+S+mT) \cdot h(n) \cdot W'(k, Un+S) +$$

$$\sum_{\substack{\delta=0 \\ \delta \neq S}}^{U-1} \sum_{n=0}^{L-1} x(Un+S+\delta+mT) \cdot [$$

$$P_\delta(n)h(n) + Q_\delta(n)h(n+1)] \cdot W'(k, Un+S+\delta).$$

Thus the memory of the encoder/decoder for the prototype filter can advantageously be organized into two segments: a first segment containing the coefficients of the initial prototype filter on which the first weighting x(Un+S+mT)·h(n) is based, and a second segment containing the interpolated coefficients. This avoids duplication of the memory required while retaining the fast algorithm. This property is retained for the synthesis of sub-bands during the reverse transformation.

In the case of a interpolation based on an initial filter having zeros at the end, the weighting operation by the filter of greater size can result in a simplification of the operations. In fact, in the central area around n=UM the coefficients of the prototype filter obtained have constant samples. Thus a factoring in the form:

$$h(M+n)\sum_{\delta=0}^{U-1}[W(k, UM+Un+S+\delta)x(UM+Un+S+\delta)]$$

can be demonstrated.

This avoids having to store interpolated samples identical to the initial prototype filter, and results in savings in the weighting operations because of the factoring. In the sample range concerned, meaning the area centered around UM, (U−1) multiplications per weighted sample are saved.

Figure 7:
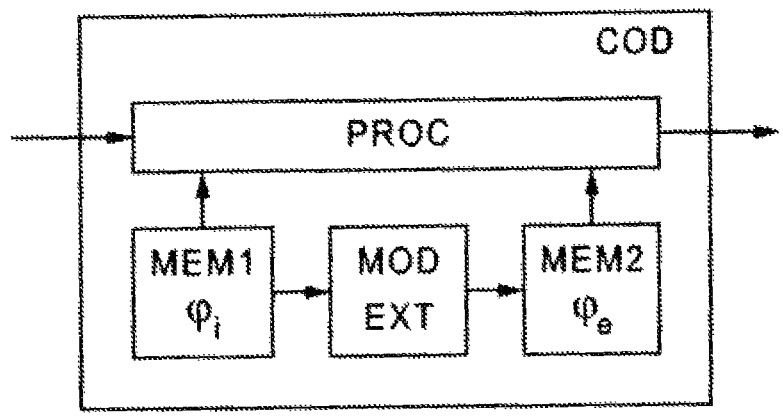
FIG. 7 is a block diagram illustrating an encoder according to an embodiment of the invention.

In the following, referring to FIG. 7, there is described an encoder adapted to implement the method described above. A decoder could have the same structure. The encoder COD comprises a processing unit PROC adapted to perform a signal analysis or synthesis, as has already been described. To perform these operations, the encoder COD makes use of a prototype filter. The encoder comprises a first memory MEM1 for storing an initial prototype filter $\phi_i$. For example, this initial filter allows modulated transforms of a maximum size M.

To perform modulated transforms of a larger size, the encoder comprises a memory MOD_EXT for storing a computer program comprising instructions for constructing a prototype filter $\phi_e$ of a size greater than $\phi_i$. To do this, additional coefficients are calculated as described above. These additional coefficients are then stored in a memory MEM2.

Figure 8:
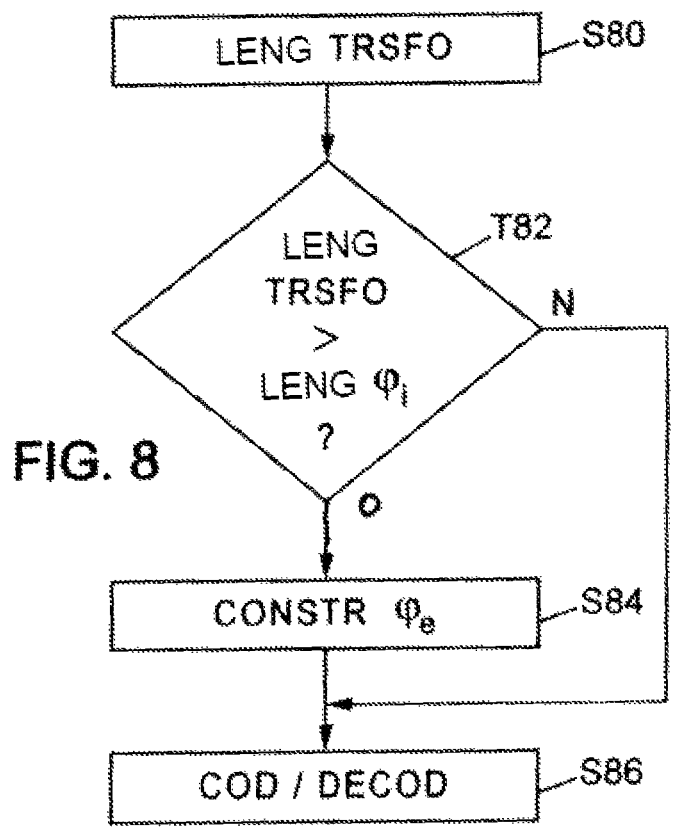
FIG. 8 is a block diagram illustrating the steps of an encoding/decoding process according to an embodiment of the invention.

FIG. 8 illustrates an encoding/decoding method which adapts the prototype filter used to the size desired for the modulated transform.

Step S80 begins by obtaining the size of the transform to be used for the analysis or synthesis of the signal to be encoded or decoded. During the test T82, it is determined whether the size of the modulated transform is greater than the size of a prototype filter $\phi_i$, stored in memory for performing the modulated transform.

If the size of the modulated transform is greater than the size of the prototype filter, one advances to step S84 for constructing a prototype filter $\phi_e$ of a larger size, as described above. Then, in step S86, the encoding or decoding of the signal is performed.

If the size of the transform is equal to the size of the filter, the construction step S82 can be skipped and one can proceed directly to step S86.

Advantageously, if the transform is of a smaller size than that of the filter, a step of reducing the filter size is done, for example by decimation before performing step S86.

Of course, the invention is not limited to the embodiments described above, and extends to other variants. For example, a calculation of additional coefficients by weighting two consecutive coefficients was described, but other embodiments can be envisaged where a larger number of coefficients are weighted.

The invention claimed is:

1. A method for updating a processing capacity of an encoder or decoder in order to use a modulated transform having a size greater than a predetermined size, said encoder or decoder being adapted to store an initial prototype filter defined by an ordered set of coefficients of an initial size, said method comprising:
   constructing, using a computer processor, a prototype filter of a size greater than said initial size to implement the transform of a size greater than the predetermined size by inserting at least one coefficient between two consecutive coefficients of the initial prototype filter.

2. The method according to claim 1, wherein the inserted coefficients are calculated from coefficients of the initial filter.

3. The method according to claim 1, wherein the coefficient inserted between said two consecutive coefficients is calculated by weighting at least said two consecutive coefficients.

4. The method according to claim 3, wherein the initial prototype filter satisfies a predetermined reconstruction relation, in which the weighting is done by way of at least one weighting function calculated from said reconstruction relation.

5. The method according to claim 4, wherein the weighting function is calculated for each position of the coefficient inserted between the two consecutive coefficients.

6. The method according to claim 1, wherein:
   the size of the constructed filter h' is U times greater than the size M of the initial filter h, where U and M are natural numbers strictly greater than one,
   a shift value S is defined such that 0≤S<U, with S being a natural number, and
   the constructed and initial filters satisfy the relation:

$h'(U \times n+S)=h(n)$, for any natural number n such that 0≤n<M.

7. The method according to claim 3, wherein
   the size of the constructed filter h' is U times greater than the size M of the base filter h, where U and M are natural numbers strictly greater than one,
   a shift value S is defined such that 0<S<U,
   two weighting functions $P_\delta$ and $Q_\delta$ are defined for any natural number δ satisfying 0<δ<U,
   the inserted coefficients are defined by the relation:

$h'(U \times n+S+\delta)=P_\delta(n) \times h(n)+Q_\delta(n) \times h(n+1)$, for any natural number n satisfying n<M.

8. A non-transitory computer program product comprising instructions for implementing the method according to claim 1 when said program is executed by a processor.

9. An encoder of digital signals, comprising:
   at least two memory areas that include a first memory area for storing a first set of coefficients defining an initial prototype filter of a given size, and second memory area for storing a computer program comprising instructions for delivering a second set of coefficients determined from coefficients in the first set, with the set formed by inserting coefficients from the second set between two consecutive coefficients of the first set, defining a prototype filter of a size greater than that of the initial prototype filter; and
   a device for implementing the method according to claim 3 for constructing the prototype filter of a size greater than that of the initial prototype filter.

10. A method of encoding by modulated transform, implemented by an encoder and comprising the steps of:

obtaining the size of a modulated transform to be used for the encoding, if the size of the transform is greater than the size of an initial prototype filter stored in the encoder, updating the processing capacity of the encoder according to the method according to claim 1, encoding the signal via said modulated transform, making use of the prototype filter constructed during the update.

11. The decoder of digital signals, comprising:

at least two memory areas that include a first memory area for storing a first set of coefficients defining an initial prototype filter of a given size, and a second memory area for storing a computer program comprising instructions for delivering a second set of coefficients determined from coefficients in the first set, with the set formed by inserting coefficients from the second set between two consecutive coefficients of the first set, defining a prototype filter of a size greater than that of the initial prototype filter; and a device for implementing the method according to claim 3 for constructing the prototype filter of a size greater than that of the initial prototype filter.

12. A method of decoding by modulated transform, implemented by a decoder and comprising the steps of:

obtaining the size of a modulated transform to be carried out for the decoding, if the size of the transform is greater than the size of an initial prototype filter stored in the decoder, updating the processing capacity of the decoder according to a method according to claim 1, decoding the signal via said modulated transform, making use of the prototype filter constructed during the update.

13. An encoder of digital signals, comprising:

at least two memory areas that include a first memory area for storing a first set of coefficients defining an initial prototype filter of a given size, and second memory area for storing a computer program comprising instructions for delivering a second set of coefficients determined from coefficients in the first set, with the set formed by inserting coefficients from the second set between two consecutive coefficients of the first set, defining a prototype filter of a size greater than that of the initial prototype filter.

14. A decoder of digital signals, comprising:

at least two memory areas that include a first memory area for storing a first set of coefficients defining an initial prototype filter of a given size, and a second memory area for storing a computer program comprising instructions for delivering a second set of coefficients determined from coefficients in the first set, with the set formed by inserting coefficients from the second set between two consecutive coefficients of the first set, defining a prototype filter of a size greater than that of the initial prototype filter.

* * * * *